May 9, 1967 T. CSAKVARY 3,319,134
SINTERED ELECTRICAL CONTACT MEMBERS
Filed April 7, 1964
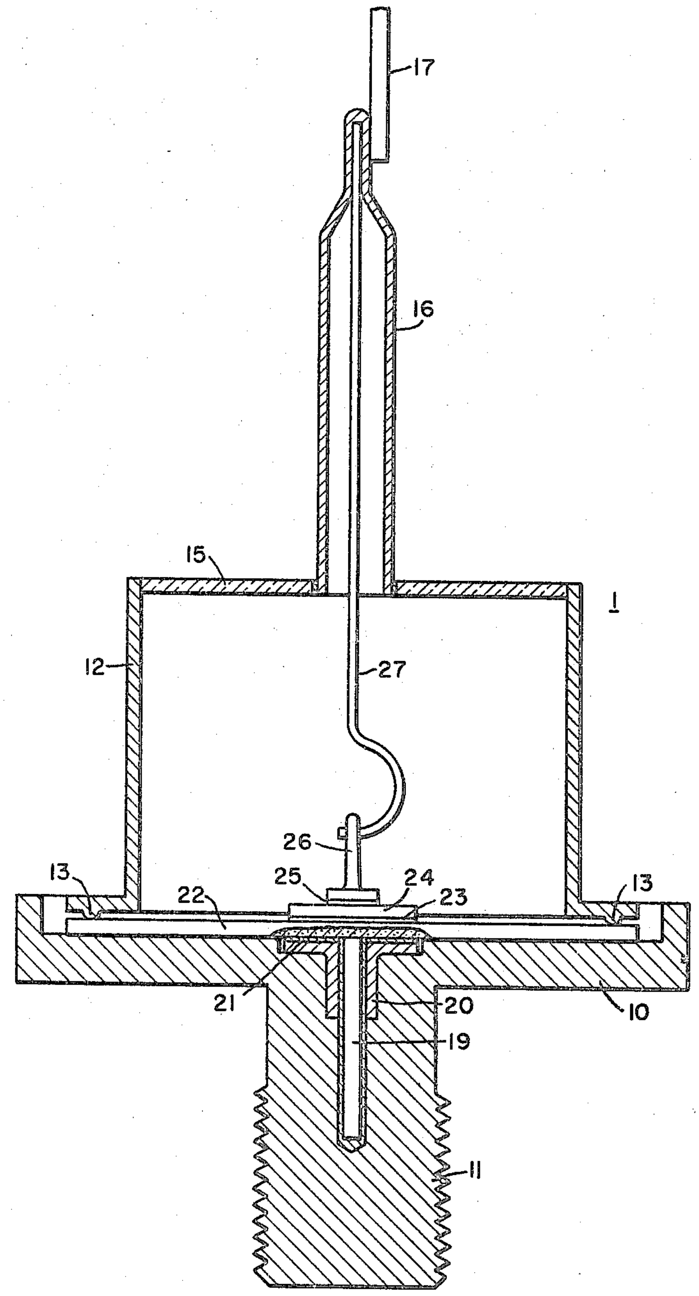
WITNESSES
Wm. B. Sellers.
H M Snyder
INVENTOR
Tibor Csakvary
BY
Frederick Shapoe
ATTORNEY United States Patent Office 3,319,134

Patented May 9, 1967

3,319,134

SINTERED ELECTRICAL CONTACT MEMBERS

Tibor Csakvary, Greensburg, Pa., assignor to Westinghouse Electric Corporation, Pittsburgh, Pa., a corporation of Pennsylvania Filed Apr. 7, 1964, Ser. No. 360,164
3 Claims. (Cl. 317—234)

This application is a continuation-in-part of application Ser. No. 125,501, filed July 20, 1961, now abandoned.

This invention relates to electrical contact members for semiconductor devices and methods for preparing the members, and, in particular to contacts for silicon semiconductor rectifiers of the p-n junction type which are specially adapted for power purposes.

In recent years, semiconductor devices comprising a member of silicon provided with at least one p-n junction have achieved notable success. When alternating electrical current is applied to one side of the p-n junction, rectification takes place since the junction has low impedance to current flow from the p-type to the n-type areas, but very high impedance to current flow from the n-type to the p-type areas of the silicon member.

The outstanding advantages of the silicon p-n junction material is that it has a high rectifier efficiency at all temperatures up to about 220° C. Germanium rectifiers, on the other hand, become quite inefficient at temperatures approaching 100° C. As a consequence, rectifiers prepared from germanium are of limited utility for power purposes since they must be cooled disproportionately to the amount required with silicon in order to prevent the temperatures from exceeding a certain predetermined maximum, ordinarily about 80° C. Relatively high capacity silicon diode rectifiers, on the other hand, can be adequately air-cooled by conducting heat therefrom by simple fins or other radiator of moderate size. Simple water cooling is adequate for the highest power silicon units. As a consequence, silicon rectifiers may be safely employed under conditions where the ambient temperatures are high or where, because of the heavy loads, it would be difficult to maintain temperatures of the rectifiers below 100° C.

The preparation of p-n junction semiconductor devices from silicon requires the solution of many difficult problems. The silicon material itself is employed in the form of extremely thin disk-shaped wafers with a thickness of the order of from 2 to 10 mils. The silicon wafers are quite brittle and fragile so that they will break or shatter if subjected to any appreciable mechanical stresses. Breakage may be encountered not only during the manufacture and assembly of the rectifiers, but also during use by reason of differential thermal expansion that takes place between the wafer of silicon in which considerable heat is generated in service and the contacts or electrodes to which it is affixed.

One of the critical problems in preparing satisfactory rectifiers from silicon semiconductor materials is to dissipate rapidly and efficiently the heat developed during use. While silicon has the ability to rectify electrical current at elevated temperatures of up to 220° C., the most efficient rectification takes place at lower temperatures. Therefore, the lowest possible operating temperatures should be maintained. Excessive temperatures, beginning at about 220° C., may impair operation in the rectifier devices and even cause failure of the rectifier if it is subjected to heavy electrical loads while at such elevated temperatures. The silicon wafer must be mounted on an end contact or base electrode of a highly heat conducting metal which is also a good electrical conductor, such as molybdenum or molybdenum-base alloy, and a solder and preferably a brazing alloy is employed to assure good thermal and electrical bonding therewith. Also, in brazing the silicon wafer to the molybdenum contact, the coefficient of thermal expansion of both is relatively close so that undue stresses are not present, also no thermal stresses are induced under normal conditions of use.

Thus, the end contact of a silicon diode rectifier must provide mechanical support for the silicon rectifier, serve as a heat sink for the heat developed in the silicon wafer, and conduct electrical current without excessive losses.

It has been the practice to punch the end contact members from a sheet of molybdenum. Since the contacts are circular disk-shaped this procedure results in an inordinately high percentage of scrap which may amount to from 40 to 45% of the molybdenum sheet. Further, efforts to make molybdenum base contacts by compacting and sintering powdered molybdenum to eliminate the scrap problem have been largely unsuccessful because of the brittleness and low strength of the processed contacts.

The object of this invention is to provide a sintered end contact made from powdered materials for use in silicon semiconductor devices which contact is mechanically strong and has good electrical and thermal conductivity, composed of a molybdenum-base alloy containing a substantial amount of silver and a small but effective amount of silicon therein.

It is a further object of this invention to produce sintered molybdenum-base alloy end contacts from appropriate quantities of molybdenum, silver and silicon powders by blending, pressing and sintering under controlled conditions.

Another object of this invention is the provision of a sintered end contact for use in silicon semiconductor devices composed of a molybdenum-base alloy containing a substantial amount of silver therein.

Other objects of the invention will, in part, be obvious, and will, in part, appear hereinafter.

For a better understanding of the nature and objects of the invention, attention is directed to the accompanying drawing, in which the figure is an enlarged vertical view, in cross-section, through a silicon semiconductor device incorporating the end contact of this invention.

The invention is directed to the production of molybdenum-base alloy compacts formed from powdered raw materials. In making the compacts according to one aspect of the invention, powdered molybdenum is blended (in an inert atmosphere such as argon) with from 0.5% to 5% by weight of silver powder and from 0.1% to 0.4% silicon powder, the blended powders are compacted to disk shape in a press at a pressure of from 20 to 80 tons per square inch and the green compact is then sintered at temperatures of from 1550° C. to 1700° C. for from 1 to 4 hours in a dry hydrogen atmosphere having a dew point of from −20° C. to −60° C. Since the sintering temperature is substantially above the melting point of silver (960° C.), a considerable amount of silver is lost by evaporation. The remaining silver forms a solid solution with the silicon and molybdenum. The alloy formed in the course of sintering contains only about 0.1% to 0.5% by weight of silver, the desired range of final silver content. It has been found that the excess silver present in the initial powder mixture is necessary to achieve the desired silver level uniformly throughout the fired compact. On the other hand, the silicon content is not appreciably affected by the sintering process and remains essentially constant. The sintered compacts are removed to a cooling chamber where they are permitted to cool in about 45 minutes more or less to room temperature in a protective atmosphere of dry hydrogen.

The product of the above process is a sintered end contact outstandingly adapted for use in silicon semiconductor devices, composed of an alloy consisting essentially of, by weight, from 0.1% to 0.5% silver, from 0.1% to 0.4% silicon and the balance essentially molybdenum.

A preferred composition for the green compact prior to sintering is about 1% silver, and an amount of up to 0.4% silicon and the balance essentially molybdenum.

An additional desirable composition for the end contact alloys of this invention consists essentially of, by weight, from 0.1% to 0.5% silver, and the balance molybdenum.

Th molybdenum powder may have an average particle size such that they will pass through sieves in the range of 250 to 650 mesh, but it is preferred that the molybdenum powder have a fineness of about 350 mesh. The silver powder should have a fineness in the range from 150 to 350 mesh and the silicon powder should have a fineness in the range from 200 to 400 mesh. The finer powders yield a fine grain size in the sintered contact, and such fine grain size is the preferred grain structure in these contacts.

The blending should be carried out for a length of time sufficient to produce thorough mixing of the powders and should lie in the range of from 2 to 4 hours or longer. The compaction pressure employed may range from 20 tons per square inch for larger particles of powder to 80 tons per square inch for very fine powders. The sintering temperature should lie in the range of from 1550° C. to 1700° C. and the time of sintering may range from one to four hours depending upon the sintering temperature, the higher temperatures, of course, requiring shorter times and vice versa. An argon atmosphere may be substituted for the dry hydrogen atmosphere.

In the alloys of this invention the silver performs two functions: (1) it raises the electrical and thermal conductivity, and (2) it increases the flow rate in compaction. Also, brazing alloys solder better to the silver-containing molybdenum compacts. The desirability of raising the electrical conductivity lies in the reduction of electrical losses. By increasing the thermal conductivity there is provided a broadening of the operable limits of the devices embodying the contacts. Raising the flow rate in compaction permits the compaction process to be carried out with greater facility, provides uniform compact density with low porosity, and thus greatly reduces the number of defective compacted disks produced.

The silicon addition substantially increases the hot strength of the end contact electrode to the extent that the hot strength of disks made in accordance with this invention are from 60% to 70% higher than that of disks punched from molybdenum sheets.

The molybdenum-base alloy of which the end contact is composed has a coefficient of thermal expansion of between about $4.8\times10^{-6}$ and $5.2\times10^{-6}$ in./° C. which is highly satisfactory for the required cooperation with a silicon wafer over the range of temperatures of fabrication and use.

For a showing of a complete rectifier, reference should be made to the figure, in which there is illustrated a silicon diode 1 incorporating a molybdenum-base alloy base contact or electrode made in accordance with this invention. The complete rectifier device 1 may have a base 10 of aluminum or copper or other suitable good heat conducting metal or alloy. The base shown in the figure is of a convenient hexagonal shape having a threaded stud 11 integral therewith for connection to a suitable electrically conducting member which can serve as a heat sink. Secured in the base 10, on the upper surface thereof, is an annular steel eyelet 20 which is joined to the molybdenum-base alloy end contact 22 by a layer of a eutectic silver-copper solder. A steel wire 19 passes through eyelet 20 and is soldered both to the end contact 22 and to stud 11. A cylindrical flanged steel housing 12 is joined to the periphery of the molybdenum end contact 22 by a heat and pressure joint 13 at the flange thereof. An annular ceramic or glass member 15 is joined hermetically to the steel housing at the upper end thereof to form an enclosure on the upper surface of the body member 10. A steel sleeve 16 is secured by a Kovar alloy ring to the inner edge of the annular ceramic member 15 to complete the enclosure. Within the enclosure is a silicon wafer 24 soldered to the upper surface of the end contact 22 by a layer of ohmic solder 23. On the upper surface of the silicon wafer 24 is a tantalum nail 26 forming a counter electrode secured thereto by the counter electrode solder 25. A copper wire 27 is soldered to the tantalum nail 26 and the upper end is crimped to the steel sleeve 16 which is connected to an external circuit by steel wire 17.

The molybdenum-base alloy end contact 22 may be of a substantial thickness of the order of 20 to 100 mils and from ⅛ to 2 inches in diameter, and even greater in the case of large power rectifiers. As has been mentioned previously, the molybdenum alloy end contact has a coefficient of linear thermal expansion which is reasonably close to that of single crystal silicon (about $2.4\times10^{-6}$ inch per degree centigrade). The molybdenum alloy has excellent thermal conductivity so that it will carry away heat rapidly from silicon disposed in contact therewith.

The solders employed for cooperation wth the molybdenum alloy disk are usually silver or alloys thereof; for example, one ohmic solder consists essentially of, by weight, about 1% antimony, about 2% lead, and the balance silver. Other satisfactory silver solders are described in U.S. Patent No. 2,763,822. Gold base solders are also highly suitable.

There follows a description of a method of forming the molybdenum alloy contact members of this invention:

*Example*

Molybdenum powder of an average particle size of about 600 mesh is blended with 1%, by weight, of sliver powder having a fineness of 300 mesh, and 0.4%, by weight, of silicon powder having a fineness of 300 mesh, and the blending is continued for a minimum of three hours. The blending is carried out in a blender filled with argon. The blended powder is placed in a compacting press capable of exerting a pressure of 35 to 50 tons per square inch on the powder and is pressed therein to green compacts. The green compacts are then sintered in a furnace at 1650° C. for one hour in an atmosphere of dry hydrogen having a dew point of −60° C. Thereafter, the compacts are cooled to room temperature in a protective atmosphere of dry hydrogen.

In order to compare contacts compacted from molybdenum alloy powders of various compositions with each other and with sheet molybdenum contacts an arbitrary test was devised by means of which a comparison could be obtained. In this test, a Rockwell hardness tester was employed using a 1/16 inch steel ball and a 60 kilogram load. When this load was impressed upon the various samples the dial reading of the instrument, which is the depth of the indentation, was taken as the value to be used for the desired comparison. The following Table I comprises a number of such readings taken on various materials during the initial work performed on the end contacts of this invention including sintered compacts made of the alloys of this invention. Thus, in the table, sheet molybdenum of the type in current use yielded a uniform value of 240 load units, which was the highest reading obtainable on the test apparatus.

TABLE I.—LOAD UNITS

| Sheet Molybdenum | 1% Ag, 0.4% Si, Bal. Mo* 600 Mesh |
|---|---|
| 240 | 240 |
| 240 | 235 |
| 240 | 235 |

*Green compact composition—Average composition after sintering, 0.2% Ag, 0.3% Si, Bal. Mo.

Only the sintered compacts having the silver-silicon-molybdenum alloy composition of this invention approached the values obtained for the sheet molybdenum in these initial tests.

Subsequent to the initial tests set forth in the above table, fifteen compacts were made by the method described in the example of the molybdenum-silver-silicon alloys of this invention using powders having an average fineness of 350 mesh. All fifteen compacts had indicated values of 240 load units when sintered and none of the compacts tested cracked during test.

Further, fifteen additional compacts were made from a 1% silver-molybdenum powder mixture having an average fineness of 350 mesh. Before compaction the loose powders were run through a furnace having a dry hydrogen atmosphere at a temperature of 700° C. to remove moisture. After sintering, the fifteen compacts were tested and all but two had a value of 240 load units and those two reached indicated values of 230 before they cracked in test. Thus, the silver-molybdenum contacts are suitable for use in silicon diode rectifiers, although the hot strength of such contacts will be somewhat inferior to the silicon-containing alloy compositions. From these last test results it is clear that powders employed in making contacts should be thoroughly dried.

It is known in the prior art to form a sintered, porous compact of a refractory metal and then infiltrate a lower melting point metal into the pores thereof by heating the latter metal to its melting point while in contact with the sintered refractory metal compact. The product of the present process is a solid solution alloy whereas the product of the prior art is a composite member in which the two metal components essentially retain their identities. The present alloy product has several advantages over the prior art composite structure with respect to its mechanical properties such as tensile strength, compressive strength and coefficient of thermal expansion.

As an indication of the relative strength of the alloy of this invention as compared with the composite structure of the prior art, tests were made as described above on a composite structure composed of about 17%, by weight, of silver and the balance tungsten. It will be recognized that sintered tungsten is generally stronger than sintered molybdenum. However, the tungsten-silver composite yielded a test reading of only about 170 to 175 load units in contrast to the readings of 235 or more obtained on the molybdenum-silver-silicon alloy.

There have thus been disclosed molybdenum-silver-silicon and molybdenum-silver alloys which when compacted and sintered are materials comparable with the sheet molybdenum currently employed as end contacts in silicon diode rectifiers. The great waste of material which resulted from the utilization of sheet molybdenum in the manufacture of the end contact disks is, therefore, eliminated.

It will be understood that the above description and drawing are illustrative and not limiting.

I claim as my invention:

1. A sintered end contact for use in silicon semiconductor devices, said end contact having a coefficient of thermal expansion of from $4.8 \times 10^{-6}$ to $5.2 \times 10^{-6}$ in./° C., closely matching that of single crystal silicon, and composed of an alloy solid solution consisting essentially, by weight, of from 0.1% to 0.5% silver, from 0.1% to 0.4% silicon and the balance essentially molybdenum.

2. A sintered end contact for use in silicon semiconductor devices, said end contact having a coefficient of thermal expansion closely matching that of single crystal silicon and composed of an alloy consisting essentially, by weight, of from 0.1% to 0.5% silver, and the balance molybdenum.

3. In a silicon semiconductor device which includes a single crystal silicon wafer and a metallic sintered end contact disk soldered thereto, said sintered end contact disk having a coefficient of thermal expansion closely matched to that of said silicon wafer, the improvement consisting in that the sintered end contact disc is composed of an alloy solid solution containing, by weight, from 0.1% to 0.5% silver, from 0.1% to 0.4% silicon and the balance essentially molybdenum.

References Cited by the Examiner

UNITED STATES PATENTS 2,180,826 11/1939 Hensel et al. -------- 29—182.5

CARL D. QUARFORTH, *Primary Examiner.*

BENJAMIN R. PADGETT, *Examiner.*

A. J. STEINER, *Assistant Examiner.*